United States Patent [19]

Blinne et al.

[11] 4,344,870

[45] Aug. 17, 1982

[54] PREPARATION OF ELECTRICALLY CONDUCTIVE HETERO-POLYAROMATICS

[75] Inventors: Gerd Blinne, Bobenheim; Herbert Naarmann, Wattenheim; Klaus Penzien, Frankenthal, all of Fed. Rep. of Germany

[73] Assignee: BASF Aktiengesellschaft, Fed. Rep. of Germany

[21] Appl. No.: 237,636

[22] Filed: Feb. 24, 1981

[30] Foreign Application Priority Data

Mar. 12, 1980 [DE] Fed. Rep. of Germany ....... 3009350

[51] Int. Cl.$^3$ ............................................. H01B 1/00
[52] U.S. Cl. ..................................... 252/517; 252/518; 252/500
[58] Field of Search ..................... 252/500, 517, 518; 260/DIG. 21

[56] References Cited

U.S. PATENT DOCUMENTS 4,204,216 5/1980 Heeger et al. ...................... 252/572
4,222,903 9/1980 Heeger et al. ...................... 252/578
4,269,738 5/1981 Pey et al. ............................ 252/500

OTHER PUBLICATIONS

J. Chem. Education, 46, (1969), No. 2, 82.
Macromolecular Syntheses Collective, vol. 1, (1977), pp. 109-110.

Primary Examiner—Joseph L. Schofer
Assistant Examiner—J. L. Barr
Attorney, Agent, or Firm—Keil & Witherspoon

[57] ABSTRACT

A process for the preparation of electrically conductive hetero-polyaromatics, having conductivities greater than $10^{-2}$ S/cm, wherein from 0.5 to 35 percent by weight of a strong Lewis acid having a $pk_a$ of from $-10$ to $+4$, preferably $AsF_5$, $SbF_5$, $UF_6$, $HClO_4$, $NO^+SbF_6^-$, $NO^+AsF_6^-$, $NO^+PF_6^-$, $NO_2^{+PF_6^-}$, $NO^+BF_4^-$, $NO_2^{+BF_4^-}$, $NO^+ClO_4^-$, $(CF_3)_2SO_4$, 2,4,6-trinitrophenol, 2,4,6-trinitrophenylsulfonic acid or 2,4,6-trinitrobenzoic acid, is added to a hetero-polyaromatic in the absence of moisture and of oxygen.

5 Claims, No Drawings

PREPARATION OF ELECTRICALLY CONDUCTIVE HETERO-POLYAROMATICS

This invention relates to a process for the preparation of electrically conductive hetero-polyaromatics having conductivities greater than $10^{-2}$ S/cm.

The preparation of polyphenylenes by oxidative coupling has been disclosed in Macromolecular Syntheses Collective 1 (1977), 109-110, and Naturwissenschaften 56 (1969), 308-313. Furthermore, the preparation of polyphenylenes by stepwise polycondensation has been disclosed by R. Gehm and W. Kern, Macromol, Chem. 7 (1951), 46-61, and this method gives particularly uniform para-linked methyl-substituted derivatives, which are not contaminated by the presence of ortho-linked or meta-linked polymers. However, the hetero-polyaromatics according to the invention differ from the above compounds through the presence of hetero-atoms, or of groups containing hetero-atoms, between the aromatic ring systems, and by the presence of not fewer than 2 phenylene groups or condensed systems between the hetero-atoms or groups containing hetero-atoms. They can be prepared by a method similar to that described by J. A. Moore in Macromolecular Syntheses 6 (1978), 45-48.

It is an object of the present invention to convert the last-mentioned hetero-polyaromatics, by incorporation of additives, into polymers having electrical conductivities greater than $10^{-2}$ S/cm.

We have found that this object is achieved, according to the invention, by adding to the hetero-polyaromatics, in the absence of moisture and of oxygen, from 0.5 to 35 percent by weight, based on hetero-polyaromatic employed, of a strong Lewis acid having a $pk_a$ of from $-10$ to $+4$. Preferably, the Lewis acid is $AsF_5$, $SbF_5$, $UF_6$, $HClO_4$, $NO^+SbF_6^-$, $NO_2^+SbF_6^-$, $NO^+AsF_6^-$, $NO^+PF_6^-$, $NO^+BF_4^-$, $NO_2^+BF_4^-$, $NO^+ClO_4^-$, $(CF_3)_2SO_4$, 2,4,6-trinitrophenol, 2,4,6-trinitrophenylsulfonic acid or 2,4,6-trinitrobenzoic acid.

For the purposes of the present invention, hetero-polyaromatics are relatively high molecular weight products whose chain consists of coupled phenyl rings which may or may not carry substituents R, the products having the general formula I or II

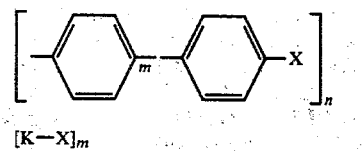

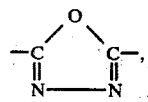

where X is $SO_2$, S, O, NH, Se or $$\begin{array}{c} O \\ / \ \backslash \\ -C \quad\quad C- \\ \| \quad\quad \| \\ N\!\!-\!\!\!-\!\!\!-\!\!N \end{array}$$

K is a fused aromatic structure, e.g. naphthalene, anthracene, perylene or coronene, R is $CH_3$, phenyl or cyclohexyl, m is from 1 to 5, preferably from 1 to 2, and n is from 5 to 1,000, preferably from 5 to 500.

Preferred hetero-polyaromatics contain phenyl rings linked in the para-position by an S or O bridge. The hetero-polyaromatics have molecular weights of from 800 to 500,000, preferably from 10,000 to 100,000. They may be prepared according to J. A. Moore, loc. cit. Different hetero-atoms X may also alternate with one another in one and the same molecule, for example as in formula III.

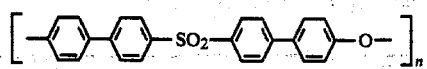

The electrical conductivities are measured by the method of F. Beck, Ber. Bunsengesellschaft, Physik, Chem., 68 (1964), 558-567, at 30° C., and are expressed in S/cm. The electrical conductivities of the novel conductive hetero-polyaromatics are greater than $10^{-2}$ S/cm.

According to the process of the invention, from 0.5 to 5 percent by weight, based on polyaromatic employed, of a strong Lewis acid having a $pk_a$ of from $-10$ to $+4$ is added to the hetero-polyaromatics, in the absence of moisture and of oxygen.

Since the additives are incorporated in the absence of moisture (water) and oxygen (air), the process is preferably carried out under a noble gas, e.g. argon, atmosphere. Auxiliary fluids, such as tetrahydrofuran, dimethoxyglycol, nitromethane or methylene chloride may be employed if appropriate, and are subsequently stripped off under reduced pressure at below 30° C.

By using the additives mentioned, electrical conductivity increases of about ten orders of magnitude can be achieved. The hetero-polyaromatics used as the starting materials for the novel compositions have initial conductivities of less than $10^{-12}$ S/cm, but after incorporation of the additives according to the invention give conductivities greater than $10^{-2}$ S/cm.

The electrically conductive hetero-polyaromatics prepared according to the invention and having conductivities greater than $10^{-2}$ S/cm may be used for the antistatic treatment of plastics, for the production of solar cells, for the conversion and fixing of radiation and for the production of electrical and magnetic switches. The incorporation of the strong Lewis acid into the hetero-polyaromatics results in p-conductors (cf. J. Chem. Education, 46 (1969), No. 2, 82).

In the Examples which follow, parts are parts by weight and percentages are mole percentages. The number n (i.e. the chain length of the polyaromatics) is determined by end group analysis, through infrared determination of the ratio of monofunctional terminal groups

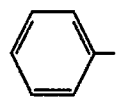

to difunctional non-terminal groups

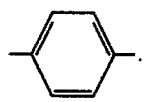

The molecular weight may be determined, for example, from the intrinsic viscosity, in dl/g, measured in $CHCl_3$ at 25° C. (cf. A. S. Hay, Macromolecular Syntheses Collective 1 (1977), 83).

EXAMPLES 1-7

The additive is added to 10 parts of a hetero-polyaromatic under an argon atmosphere, with exclusion of moisture. The electrical conductivity is measured by the method of F. Beck, loc. cit.

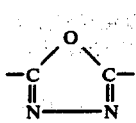

Hetero-polyaromatics

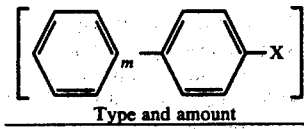

Type and amount

| No. | m | X | Molecular weight | Additive Type, and amount in mole % | | Conductivity, S/cm at 30° C. without additive | with additive |
|---|---|---|---|---|---|---|---|
| 1 | 10 parts | 2 S | 30,000 | AsF$_5$ | 0.2 | $<10^{-13}$ | $4.0 \times 10^{+2}$ |
| 2 | 10 parts | 3 S | 12,000 | SbF$_5$ | 0.18 | $<10^{-13}$ | $0.5 \times 10^{+2}$ |
| 3 | 10 parts | 2 O | 50,000 | HClO$_4$ | 0.2 | $<10^{-13}$ | $4.3 \times 10^{+}$ |
| 4 | 10 parts | 3 O | 26,000 | HClO$_4$ | 0.2 | $<10^{-13}$ | $2.9 \times 10^{+1}$ |
| 5 | 10 parts | 2 NH | 14,000 | 2,4,6-trinitrophenyl-sulfonic acid | 0.2 | $<10^{-13}$ | $1.8 \times 10^{+}$ |
| 6 | 10 parts | 2 Se | 24,000 | 2,4,6-trinitrophenyl-sulfonic acid | 0.2 | $<10^{-13}$ | $6.4 \times 10^{-1}$ |
| 7 | 10 parts | 4 O | 30,000 | NO$^+$SbF$_6^-$ | 0.3 | $<10^{-13}$ | $5.7 \times 10^{-1}$ |
| 8 | 10 parts | 3 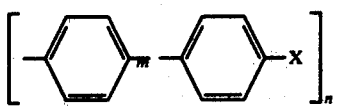 | 27,000 | NO$^+$PF$_6^-$ | 0.3 | $\sim 10^{-12}$ | $3.4 \times 10^{+1}$ |
| 9 | 10 parts | 5 S | 25,000 | NO$_2^+$AsF$_6^-$ | 0.3 | $<10^{-12}$ | $2.6 \times 10^{+2}$ |
| 10 | 10 parts | 2 SO$_2$ | 50,000 | NO$_2^+$AsF$_6^-$ | 0.3 | $<10^{-12}$ | $3.4 \times 10^{+1}$ |

[K X]$_n$ Type and amount

| No. | | n | X | Molecular weight | Additive Type, and amount in mole % | | Conductivity, S/cm at 30° C. without additive | with additive |
|---|---|---|---|---|---|---|---|---|
| 11 | 10 parts, K = naphthalene | 2 | S | 350 | AsF$_5$ | 0.2 | $<10^{-12}$ | $4.8 \times 10^{-1}$ |
| 12 | 10 parts, K = anthracene | 2 | S | 500 | AsF$_5$ | 0.2 | $<10^{-12}$ | $3.9 \times 10^{-1}$ |
| 13 | 10 parts, K = perylene | 2 | S | 550 | AsF$_5$ | 0.2 | $<10^{-12}$ | $5.8 \times 10^{-1}$ |
| 14 | 10 parts, K = carbazole | 2 | S | 600 | AsF$_5$ | 0.2 | $<10^{-12}$ | $2.1 \times 10^{+2}$ |
| 15 | 10 parts, K = naphthalene | 40 | S | 6,100 | AsF$_5$ | 0.2 | $<10^{-12}$ | $6.0 \times 10^{-1}$ |

We claim:

1. A process for the preparation of electrically conductive hetero-polyaromatics having conductivities greater than $10^{-2}$ S/cm which comprises: adding to a hetero-polyaromatic of the formula

   I ps or the formula

[K—X]$_m$   II where X is SO$_2$, S, O, NH, Se or K is naphthalene, anthracene, perylene or coronene, m is from 1 to 5, preferably from 1 to 2, and n is from 5 to 1,000, preferably from 5 to 500, in the absence of moisture and of oxygen, from 0.5 to 35 percent by weight, based on the weight of the hetero-polyaromatic, of a strong Lewis acid having a pk$_a$ of from $-10$ to $+4$.

2. The process of claim 3, wherein the Lewis acid used is AsF$_5$, SbF$_5$, UF$_6$, HClO$_4$, NO$^+$SbF$_6^-$, NO$_2^+$SbF$_6^-$, NO$^+$AsF$_6^-$, NO$^+$PF$_6^-$, NO$_2^+$PF$_6^-$, NO$^+$BF$_4^-$, NO$_2^+$BF$_4^-$, NO$^+$ClO$_4^-$, (CF$_3$)$_2$SO$_4$, 2,4,6-trinitrophenol, 2,4,6-trinitrophenylsulfonic acid or 2,4,6-trinitrobenzoic acid.

3. The process of claim 1, wherein X is S or O.

4. The process of claim 3, wherein m is 1 to 2 and n is 5 to 500.

5. An electrically conductive hetero-polyaromatic having a conductivity greater than $10^{-2}$ S/cm and produced by the process of claim 1 or claim 2.

* * * * *

UNITED STATES PATENT AND TRADEMARK OFFICE
CERTIFICATE OF CORRECTION

PATENT NO. : 4,344,870

DATED : August 17, 1982

INVENTOR(S) : Gerd Blinne, Herbert Naarmann and Klaus Penzien

It is certified that error appears in the above-identified patent and that said Letters Patent is hereby corrected as shown below:

On the title page

IN THE ABSTRACT

Line 6, change "$SbF_6-$" to --$SbF_6^-$--.

Line 6, change "$AsF_6-$" to --$AsF_6^-$--.

Line 6, change "$PF_6-$" to --$PF_6^-$--.

Line 6, change "$PF_6-$" to --$PF_6^-$--.

Line 7, change "$BF_4-$" to --$BF_4^-$--.

Line 7, change "$BF_4-$" (second occurrence) to --$BF_4^-$--.

Line 7, change "$ClO_4-$" to --$ClO_4^-$--.

IN THE CLAIMS

Claim 1, in the line following the formula delete "ps".

Signed and Sealed this

Seventh Day of June 1983

[SEAL]

Attest:

DONALD J. QUIGG

Attesting Officer

Acting Commissioner of Patents and Trademarks